(12) United States Patent
Aoyama

(10) Patent No.: US 8,117,572 B2
(45) Date of Patent: Feb. 14, 2012

(54) DATA PROCESSING DEVICE, BEHAVIORAL SYNTHESIS DEVICE, DATA PROCESSING METHOD, AND RECORDING MEDIUM

(75) Inventor: Tetsuya Aoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 378 days.

(21) Appl. No.: 12/402,668

(22) Filed: Mar. 12, 2009

(65) Prior Publication Data

US 2009/0235220 A1  Sep. 17, 2009

(30) Foreign Application Priority Data

Mar. 13, 2008 (JP) ................................. 2008-063705

(51) Int. Cl.
*G06F 17/50* (2006.01)
*G06F 9/45* (2006.01)
(52) U.S. Cl. .......................... 716/104; 716/101; 716/103
(58) Field of Classification Search .................. 716/101, 716/103–104
See application file for complete search history.

(56) References Cited

U.S. PATENT DOCUMENTS

| 2006/0225022 A1* | 10/2006 | Ezaki ............................... 716/18 |
| 2007/0006112 A1* | 1/2007 | Gutberlet et al. ................ 716/18 |
| 2007/0168902 A1* | 7/2007 | Ogawa et al. .................... 716/18 |
| 2008/0077906 A1* | 3/2008 | Bowyer et al. ................... 716/18 |
| 2009/0228859 A1* | 9/2009 | Aoyama .......................... 716/18 |

FOREIGN PATENT DOCUMENTS

JP       2006285865 A       10/2006

* cited by examiner

*Primary Examiner* — Stacy Whitmore

(57) ABSTRACT

A behavioral synthesis unit generates an intermediate level description that describes a plurality of processes indicated by a behavioral level description and data passed over during the plurality of processes based oil a behavioral level description describing the behavior of an electronic circuit and synthesis constraint information constituting constraints to be satisfied while generating a register transfer level description based on the behavioral level description and the number and type of circuit configuration elements that can be described in the register transfer level description. The data flow path information analyzing unit acquires path information indicating a data path and at least one process executed on the path based on the intermediate level description. A synthesis constraint generating unit then generates new synthesis constraint information that improves prescribed circuit performance of the electronic circuit based on library information and path information.

8 Claims, 9 Drawing Sheets

FIG. 2

BEHAVIORAL LEVEL DESCRIPTION

```
sc_uint<4> a0, a1;
sc_uint<5> b0, b1;
sc_uint<8> c0;
sc_uint<8> d0;
sc_uint<16> e0, e1;
sc_uint<16> f0;

sc_uint<5> t0;
sc_uint<6> t1;
sc_uint<7> t2;
sc_uint<8> t3;
sc_uint<16> t4, t5;

void main()
{
        t0 = a0 + a1;         ←——— A1
        t1 = b0 + b1;         ←——— A2
        t2 = t0 + t1;         ←——— A3
        t3 = t2 + c0 + d0;    ←——— A4
        t4 = e0 + e1;         ←——— A5
        t5 = f0 + t4;         ←——— A6
}
```

FIG. 3

LIBRARY STORAGE AREA

| LIBRARY ID | FUNCTIONAL UNIT TYPE | BIT WIDTH | AREA | DELAY TIME | CHAIN EFFECT | |
|---|---|---|---|---|---|---|
| | | | | | INPUT | DELAY TIME |
| L1 | ADDER | 4 | 60 | 40 | | |
| L2 | ADDER | 4 | 40 | 50 | | |
| L3 | ADDER | 5 | 70 | 50 | | |
| L4 | ADDER | 5 | 50 | 60 | | |
| L5 | ADDER | 6 | 100 | 65 | L1 | 50 |
| | | | | | L3 | 55 |
| L6 | ADDER | 6 | 80 | 75 | L2 | 30 |
| | | | | | L4 | 35 |
| L7 | ADDER | 8 | 130 | 80 | L7 | 70 |
| L8 | ADDER | 8 | 110 | 90 | L8 | 50 |
| L9 | ADDER | 16 | 300 | 120 | | |
| L10 | ADDER | 16 | 200 | 140 | | |

FIG. 4

SYNTHESIS CONSTRAINT STORAGE AREA

| LIBRARY ID | CONSTRAINT NUMBER |
|---|---|
| L1 | 1 |
| L2 | 0 |
| L3 | 1 |
| L4 | 0 |
| L5 | 1 |
| L6 | 0 |
| L7 | 2 |
| L8 | 0 |
| L9 | 1 |
| L10 | 0 |

FIG. 8

PATH INFORMATION STORAGE AREA

| TIMING | PATH ID | PATH | TYPE OF FUNCTION ON PATH | DELAY TIME |
|---|---|---|---|---|
| STEP1 | P1 | {a0,a1}→t0→t2 | n1(4BIT ADDITION)<br>n3(6BIT ADDITION) | 90 |
| | P2 | {b0,b1}→t1→t2 | n2(5BIT ADDITION)<br>n3(6BIT ADDITION) | 105 |
| | P3 | {e0,e1}→t4 | n6(16BIT ADDITION) | 120 |
| STEP2 | P4 | {c0,t2}→t3 | n4(8BIT ADDITION)<br>n5(8BIT ADDITION) | 150 |
| | P5 | {f0,t4}→t5 | n7(16BIT ADDITION) | 120 |

FIG. 9

SYNTHESIS CONSTRAINT STORAGE AREA

| LIBRARY ID | CONSTRAINT NUMBER |
|---|---|
| L1 | 0 |
| L2 | 1 |
| L3 | 0 |
| L4 | 1 |
| L5 | 0 |
| L6 | 1 |
| L7 | 0 |
| L8 | 2 |
| L9 | 0 |
| L10 | 1 |

DATA PROCESSING DEVICE, BEHAVIORAL SYNTHESIS DEVICE, DATA PROCESSING METHOD, AND RECORDING MEDIUM

This application is based on Japanese Patent Application No. 2008-063705 filed on Mar. 13, 2008 and including specification, claims, drawings and summary. The disclosure of the above Japanese Patent Application is incorporated herein by reference in its entirety.

BACKGROUND OF THE INVENTION

1. Field of the Invention

The present invention relates to a data processing device, a behavioral synthesis device, a data processing method, and a recording medium that are capable of appropriately processing synthesis constraint information indicating constraints to be intended to fulfill during behavioral synthesis.

2. Description of the Related Art

Currently, behavioral synthesis technology that generates descriptions for a register transfer level from behavioral level (RTL descriptions or RT level descriptions) circuit descriptions (behavioral level descriptions) is well-known as technology for supporting the design of semiconductor integrated circuits such as LSIs and VLSIs. Such behavioral synthesis technology is disclosed, for example, in Unexamined Japanese Patent Application KOKAI Publication No. 2006-285865 (hereinafter, "patent literature 1").

It is necessary, however, for a circuit designer etc. to prepare information indicating constraints such as a number of configuration elements of a circuit (hereinafter, "synthesis constraint information") beforehand when behavioral synthesis processing is carried out. Behavioral synthesis processing is carried out based oil constraints indicated by this synthesis constraint information.

Circuit performance (delay time, area etc.) of circuits indicated by an RT level description made in behavioral synthesis processing deteriorates when the synthesis constraint information is not specified appropriately. It is therefore necessary for the circuit designer to make appropriate synthesis constraint information.

However, the production of appropriate synthesis constraint information is difficult for a circuit designer. The first reason for this is because synthesis constraint information to be prepared has to be information compatible with a library including a wide variety of circuit information for circuits that are the target of design. A second reason is because if the behavioral synthesis method applied to the behavioral level description is different, the appropriate synthesis constraint information to be prepared will also be different.

In order to resolve the above situation, it is an object of the present invention to provide a data processing device, a behavioral synthesis device, a data processing method, and a program that are capable of subjecting synthesis constraint information indicating constraints intended to be fulfilled during behavioral synthesis to appropriate processing so as to enable the synthesis of an RT level description giving superior circuit performance.

SUMMARY OF THE INVENTION

In order to achieve the above object, a data processing device of a first aspect of the invention comprises:

a behavioral level description receiving unit that receives input of a behavioral level description describing the behavior of an electronic circuit to be mounted on a semiconductor integrated circuit;

a synthesis constraint information receiving unit that receives an input of synthesis constraint information constituting constraints to be satisfied while generating a register transfer level description based on the behavioral level description, the constraints indicates the type and number of circuit configuration elements that can be described in the register transfer level description;

an intermediate level description generating unit that generates an intermediate level description that describes a plurality of processes indicated by the behavioral level description and data passed over during the plurality of processes based on the behavioral level description and the received synthesis constraint information;

a path information acquiring unit that acquires path information indicating the data path and at least one process executed on the data path based on the intermediate level description;

a synthesis constraint information generating unit that generates new synthesis constraint information that improves prescribed circuit performance of the electronic circuit based on library information specifying circuit configuration elements that can be described in the register transfer level description and the path information.

In order to achieve the above object, a behavioral synthesis device of a second aspect of the invention comprises:

a behavioral level description receiving unit that receives input of a behavioral level description describing the behavior of an electronic circuit to be mounted on a semiconductor integrated circuit;

a synthesis constraint information receiving unit that receives the input of synthesis constraint information constituting constraints to be satisfied while generating a register transfer level description based on the behavioral level description, the constraints indicates the type and number of circuit configuration elements that can be described in the register transfer level description;

an intermediate level description generating unit that generates an intermediate level description that describes a plurality of processes indicated by the behavioral level description and data passed over during the plurality of processes based on the behavioral level description and the received synthesis constraint information;

a path information acquiring unit that acquires path information indicating the data path and at least one process executed on the data path based on the intermediate level description;

a synthesis constraint information generating unit that generates new synthesis constraint information that improves prescribed circuit performance of the electronic circuit based on library information specifying circuit configuration elements that can be described in the register transfer level description and the path information; and a behavioral synthesis unit that generates a register transfer level description based on the behavioral level description so as to satisfy constraints indicated by the newly generated synthesis Constraint information.

In order to achieve the above object, a data processing method of a third aspect of the invention comprises:

a data processing method executed by a data processing device having a behavioral level description receiving unit, a synthesis constraint information receiving unit, an intermediate level description generating unit, a path information acquiring unit, and a synthesis constraint information receiving unit, the method comprising:

a behavioral level description receiving step of receiving, by the behavioral level description receiving unit, input of a behavioral level description describing behavior of an electronic circuit to be mounted on a semiconductor integrated circuit;

a synthesis constraint information receiving step of receiving, by the synthesis constraint information receiving unit, input of synthesis constraint information constituting constraints to be satisfied while generating a register transfer level description based on the behavioral level description, the constraints indicates the type and number of circuit configuration elements that can be described in the register transfer level description;

an intermediate level description generating step of generating, by the intermediate level description generating unit, an intermediate level description that describes a plurality of processes indicated by the behavioral level description and data passed over during the plurality of processes based on the behavioral level description and the received synthesis constraint information;

a path information acquiring step of acquiring, by the path information acquiring unit, path information indicating the data path and at least one process executed on the data path based on the intermediate level description; and a synthesis constraint information generating step of generating, by the synthesis constraint information generating unit, new synthesis constraint information that improves prescribed circuit performance of the electronic circuit based on library information specifying circuit configuration elements that can be described in the register transfer level description and the path information.

In order to achieve the above object, a recording medium of a fourth aspect of the present invention is recorded with a program enabling a computer to function as:

a behavioral level description receiving unit that receives input of a behavioral level description describing the behavior of an electronic circuit to be mounted on a semiconductor integrated circuit;

a synthesis constraint information receiving unit that receives the input of synthesis constraint information constituting constraints to be satisfied while generating a register transfer level description based on the behavioral level description, the constraints indicates the type and number of circuit configuration elements that can be described in the register transfer level description;

an intermediate level description generating unit that generates an intermediate level description that describes a plurality of processes indicated by the behavioral level description and data passed over during the plurality of processes based on the behavioral level description and the received synthesis constraint information;

a path information acquiring unit that acquires path information indicating the data path and at least one process executed on the data path based on the intermediate level description; and a synthesis constraint information generating unit that generates new synthesis constraint information that improves prescribed circuit performance of the electronic circuit based on the library information specifying circuit configuration elements that can be described in the register transfer level description and the path information.

According to the present invention, it is possible for synthesis constraint information to be appropriately processed so as to enable the synthesis of an RT level description with superior circuit performance.

BRIEF DESCRIPTION OF THE DRAWINGS

FIG. 2 is a diagram showing an example of a behavioral level description;

FIG. 3 is a diagram showing an example of library information stored in a library storage area;

FIG. 4 is a diagram showing an example of synthesis constraint information stored in the synthesis constraint storage area;

FIG. 8 is a diagram showing an example of path information stored in the path information storage area; and FIG. 9 is a diagram showing an example of updated synthesis constraint information stored in a synthesis constraint storage area.

DETAILED DESCRIPTION OF THE PREFERRED EMBODIMENTS

The following is an explanation with reference to the drawings of a behavioral synthesis device 100 of an embodiment of the present invention. The behavioral synthesis device 100 outputs descriptions representing circuits using register transfer levels (hereinafter referred to as "register transfer level descriptions" or "RT level descriptions") by subjecting descriptions (hereinafter referred to as "behavioral level descriptions") representing circuits such as semiconductor integrated circuits using behavioral levels to behavioral synthesis. The behavioral synthesis device 100 then automatically updates the synthesis constraint information indicating constraints to be satisfied while generating a register transfer level description from the behavioral level description prior to the behavioral synthesis. Namely, the behavioral synthesis device 100 includes a function of a behavioral synthesis device, and a function of a data processing device that updates the synthesis constraint information. It is therefore possible to appropriately update synthesis constraint information generated manually by the designer prior to the behavioral synthesis in the event of the designer performing behavioral synthesis using the behavioral synthesis device 100.

The embodiment is provided for ease of understanding of the theory of the present invention and by no means restricts the range of the present invention itself. Other embodiments resulting from one skilled in the art appropriately changing the configuration of the following embodiment are also included in the scope of the present invention.

First Embodiment

Figure 1:
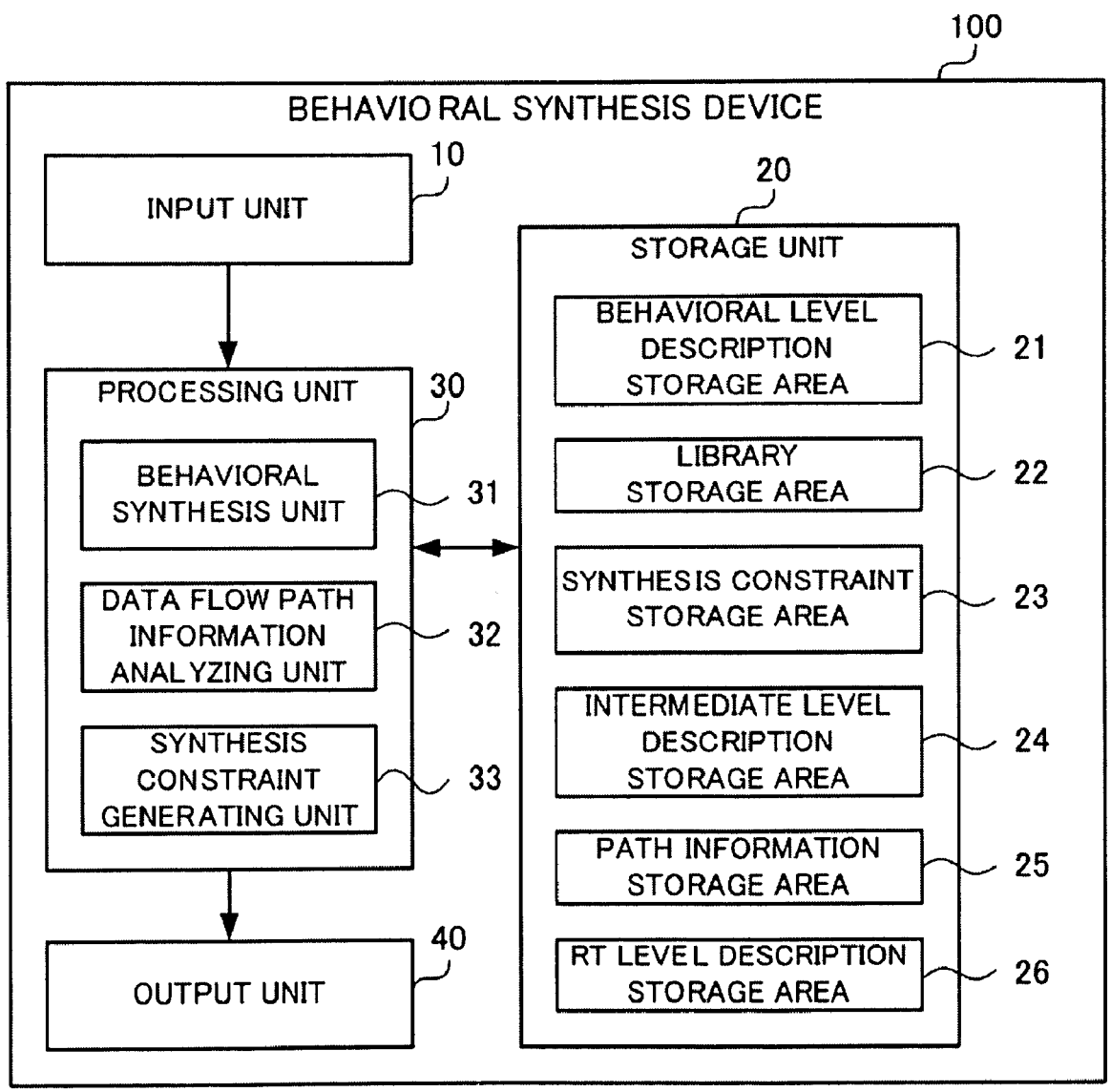
FIG. 1 is a block diagram showing a configuration for a behavioral synthesis device of this embodiment.

The behavioral synthesis device 100 of a first embodiment includes an input unit 10, a storage unit 20, a processing unit 30, and an output unit 40, as shown in FIG. 1.

The input unit 10 supplies information instructing behavioral synthesis to be carried out, which is inputted by the user and behavioral level descriptions etc. to the processing unit 30. The input unit 10 can also receive data stored in the storage unit 20 such as synthesis constraint information and supply the data to the processing unit 30. Data supplied to the processing unit 30 may also be stored in the storage unit 20 as appropriate. The input unit 10 can be constructed from a keyboard, mouse, and flexible disk drive etc.

The storage unit 20 can be constructed from, for example, a storage device such as a hard disk. In addition to storing a behavior program executed by the processing unit 30, the storage unit 20 stores various data necessary for implementing the present invention. In this embodiment, storage areas such as a behavioral level description storage area 21, a library storage area 22, a synthesis constraint storage area 23, an intermediate level description storage area 24, a path information storage area 25, and an RT level description storage area 26 can be provided with in the storage unit 20, with prescribed data being stored in each of the storage areas.

The behavioral level description storage area 21 is an area for storing behavioral level descriptions. An example of a behavioral level description described using SystemC is shown in FIG. 2.

The description of FIG. 1 is now returned to. Information relating to the circuit configuration elements such as a functional unit, a memory, an input/output terminal, a multiplexer, a register, a decoder, logic operation, and constant tables is recorded as library information in the library storage area 22. It is necessary for the RT level description for a semiconductor integrated circuit to be configured using circuit configuration elements recorded in the library storage area 22.

A schematic example of library information stored in the library storage area 22 is shown in FIG. 3. In this example, adders of bit widths of 4, 5, 6, 8, and 16 are registered in the library storage area 22 two types at a time. Each of the adders is assigned with IDs (library IDs) for identification use of L1 to L10.

Information relating to a chain effect is also provided to this library information as attribute information. The chain effect refers to a property where overall circuit delay time is smaller than the sum of the delay times for each circuit configuration element when a plurality of circuit configuration elements are connected together to construct a circuit. In an example of an adder in which the library ID for the library information, which is presented in FIG. 3, is L5, the chain effect shows that the delay for this adder becomes 50 when an output of the adder L1 is taken as an input.

The description of FIG. 1 is now returned to. The synthesis constraint storage area 23 is an area for storing synthesis constraint information indicating constraints required while generating an RT level description using behavioral synthesis processing. Specifically, as shown in FIG. 4, information specifying a number of circuit configuration elements included in the RT level description is stored in the synthesis constraint storage area 23 as synthesis constraint information. Conditions such as operating frequency (delay time) and area may be stored in the synthesis constraint storage area 23 as synthesis constraint information for the circuit as a whole or every type of operator included in the circuit.

The behavioral level descriptions, library information, and synthesis constraint information described above have to be made beforehand by a circuit designer etc. prior to carrying out the behavioral synthesis processing and have to be stored in each area.

The intermediate level description storage area 24 is an area for storing a description (intermediate level description) generated by each of the processes for the behavioral synthesis (scheduling processing, binding processing, and the optimization processes etc.). For example, in the scheduling process, a CDFG (Control Data Flow Graph) is produced and is stored in the intermediate level description storage area 24.

The description of FIG. 1 is now returned to. The RT level description storage area 26 is an area that stores a register transfer level description finally generated from the behavioral level description using behavioral synthesis processing.

The path information storage area 25 is an area stored with path information made by a data flow path information analyzing unit 32 described below.

The processing unit 30 includes a CPU (Central Processing Unit), a ROM (Read Only Memory) and a RAM (Random Access Memory) or the like and controls the operation of the behavioral synthesis device 100 by executing an operation program stored in the RAM or the storage unit 20 while taking the ROM as a work area.

The processing unit 30 functionally includes a behavioral synthesis unit 31, the data flow path information analyzing unit 32, and a synthesis constraint generating unit 33.

The behavioral synthesis unit 31 performs behavioral synthesis processing that synthesizes an RT level description from a behavioral level description based on the library information stored in the library storage area 22 and the synthesis designation information stored in the synthesis constraint storage area 23. Processes such as scheduling processing, binding processing, and another optimization processing are included in the behavioral synthesis processing.

Figure 5:
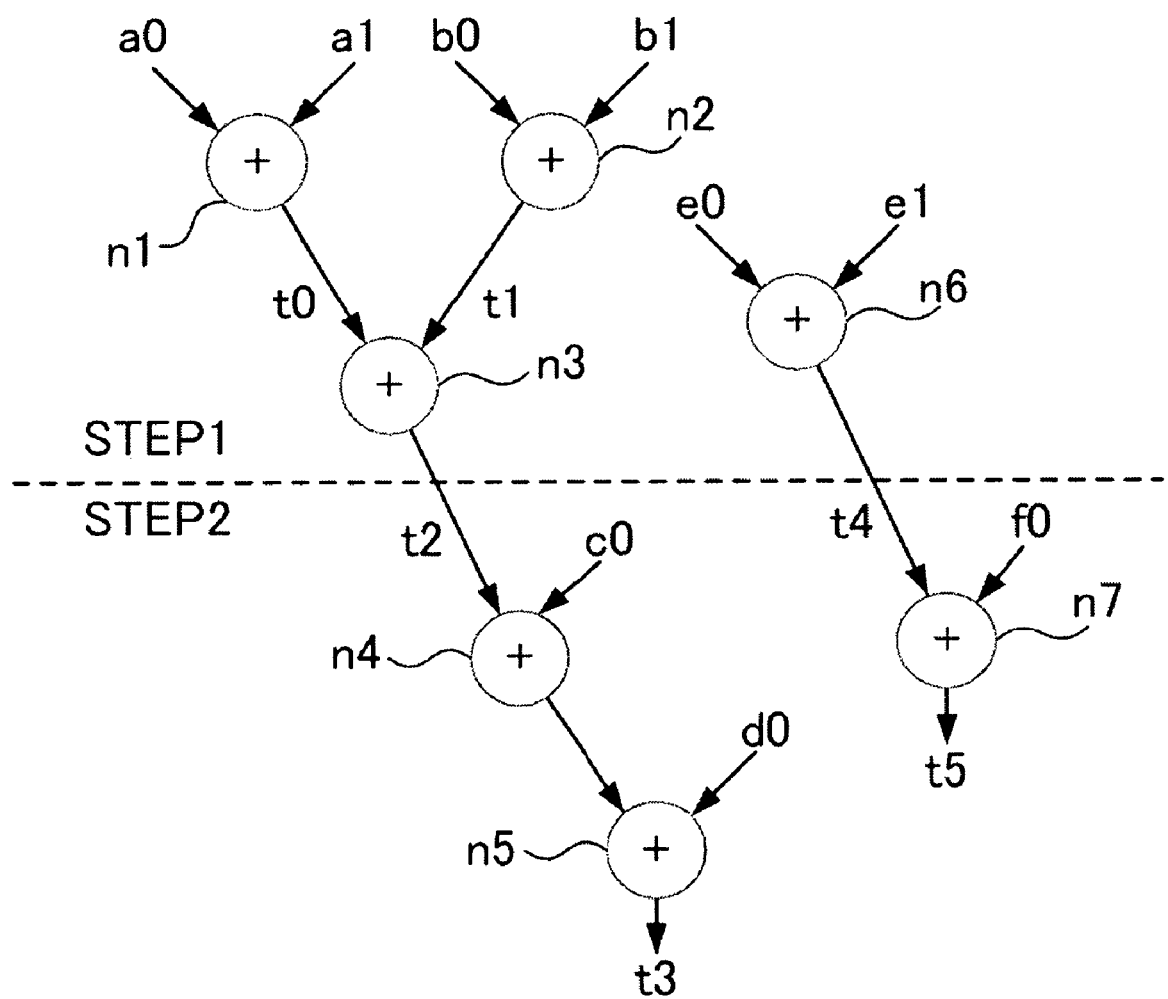
FIG. 5 is a diagram showing an example of a CDFG.

The scheduling processing is processing for making a CDFG as shown in FIG. 5 by extracting the flow of control and data from a behavioral level description, the CDFG is an intermediate level description that includes time information indicating what kind of processing and functions etc. are to be executed at which time. The synthesis constraint information stored in the synthesis constraint storage area 23 can be referred to in the schedule processing.

The binding processing is processing for allocating the necessary hardware resources (circuit elements such as functional units and registers etc.) to each of the scheduled processes within the behavioral level description.

The other optimizing processing is processing such as conversion to formats suited to post-processing such as cancellation of function calls, deletion of unnecessary codes, transformation processing by language level optimization, and logic optimization processing constituting subsequent processing.

The behavioral synthesis unit 31 stores an intermediate level description made as a result of each of the processes described above (scheduling processing, binding processing, and other optimization processing) in the intermediate level description storage area 24. The behavioral synthesis unit 31 finally makes an RT level description as a result of each of the processes described above and stores the RT level description in the RT level description storage area 26.

The data flow path information analyzing unit 32 reads out the CDFG from the intermediate level description storage area 24 for analysis. The data flow path information analyzing unit 32 then acquires path information including the type of function executed on each path on the data flow and the path delay information every process time (step) and stores path information in the path information storage area 25.

The synthesis constraint generating unit 33 then generates new synthesis constraint information based on the library information stored in the library storage area 22, the path information stored in the path information storage area 25, and the behavioral level description stored in the behavioral level description storage area 21. Here, the synthesis constraint information is generated in such a manner that prescribed circuit performance of the generated circuit can be optimized using the synthesis constraint information. A prescribed circuit performance is, for example, the length of the delay time (length of the processing time) or the area of the circuit. The synthesis constraint information comprises types and numbers of circuit configuration elements. The synthesis constraint generating unit 33 stores the generated synthesis constraint information in the synthesis constraint storage area 23.

The output unit 40 outputs synthesis constraint information stored in the synthesis constraint storage area 23 and RT level descriptions etc. stored in the path information storage area 25 to an external device of the behavioral synthesis device 100 etc. as appropriate. The output unit 40 is, for example, a flexible disk drive, a network card, or a USB (Universal Serial Bus) port etc.

An explanation is now given of the synthesis constraint updating processing carried out by the behavioral synthesis device 100 of the above configuration. It is taken that the behavioral level description, the library information, and the synthesis constraint information are stored in the behavioral level description storage area 21, the library storage area 22, and the synthesis constraint storage area 23, respectively.

Figure 6:
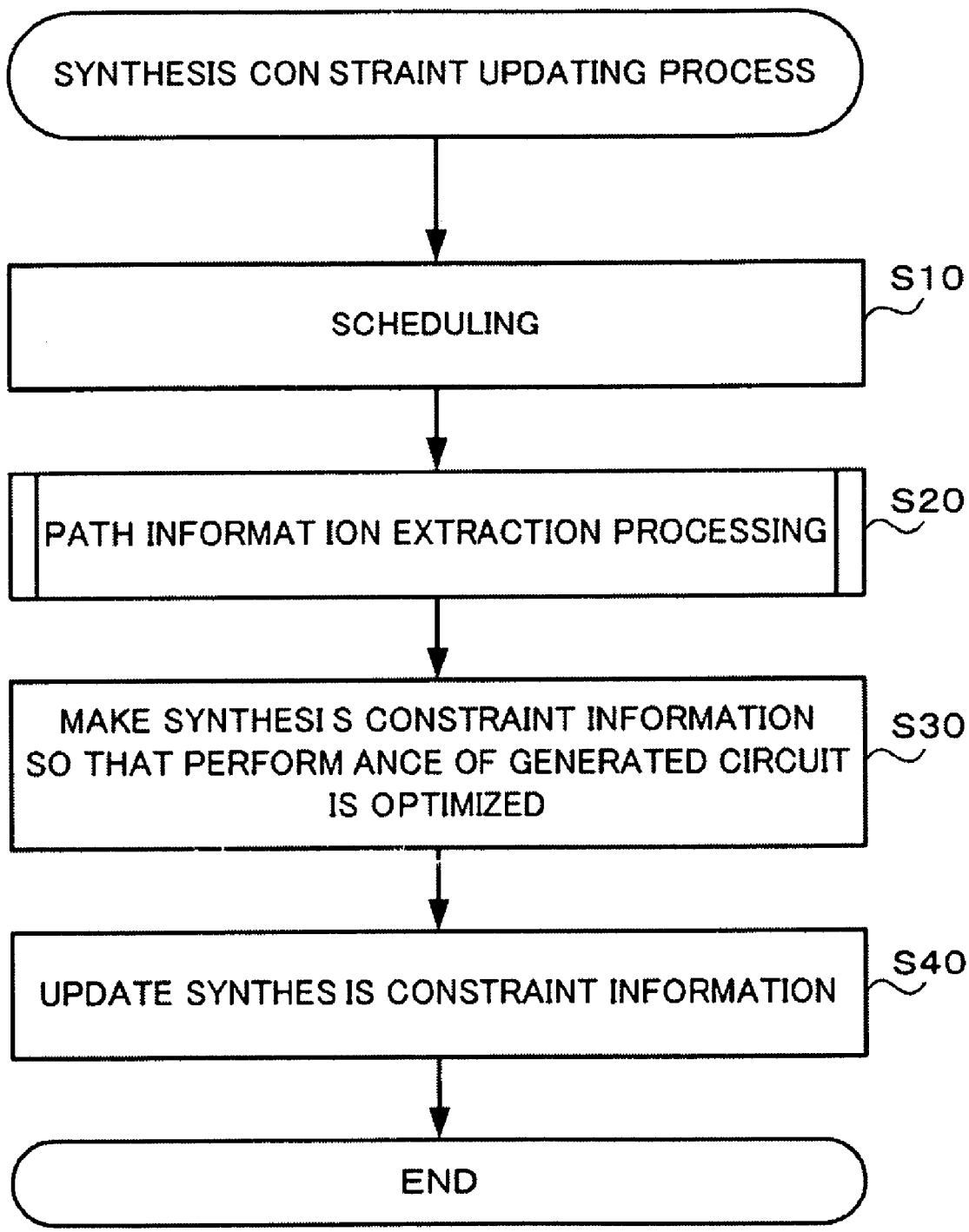
FIG. 6 is a flowchart illustrating synthesis constraint updating processing.

When the user instructs synthesis constraint updating processing from the input unit 10 of the behavioral synthesis device 100, the processing unit 30 commences the synthesis constraint updating processing shown in FIG. 6 in response to this input.

When the synthesis constraint updating processing commences, first, the behavioral synthesis unit 31 of the processing unit 30 performs scheduling that is one of the behavioral synthesis processes (step S10). Namely, the behavioral synthesis unit 31 analyses the behavioral level descriptions stored in the behavioral level description storage area 21 and extracts the flow of control and data. The behavioral synthesis unit 31 then produces a CDFG including timing information indicating which processing and functions etc. are intended for execution at which timings (or state, or step) and stores the CDFG in the intermediate level description storage area 24.

When, for example, the behavioral level description shown in FIG. 2 is taken to be the target of processing of step S10, the CDFG shown in FIG. 5 is made. A 4-bit addition process statement A1, a 5-bit addition process statement A2, and a 6-bit addition process statement A3 within the behavioral level description correspond to operation nodes n1, n2, and n3 respectively expressing addition processing within the CDFG. 8-bit addition process statement A4 within the behavioral level description corresponds to operation nodes n4 and n5 within the CDFG. 16-bit addition process statements A5 and A6 within the behavioral level description correspond to operation nodes n6 and n7 respectively expressing addition processing within the CDFG. A state of step 1 is allocated to the operation nodes n1, n2, n3, n6, and a state of step 2 is allocated to operation nodes n4, n5, and n7 as time information in this CDFG.

The description of FIG. 6 is now returned to. The data flow path information analyzing unit 32 then performs path information extraction processing that extracts path information on the data flow from the produced CDFG (step S20).

Figure 7:
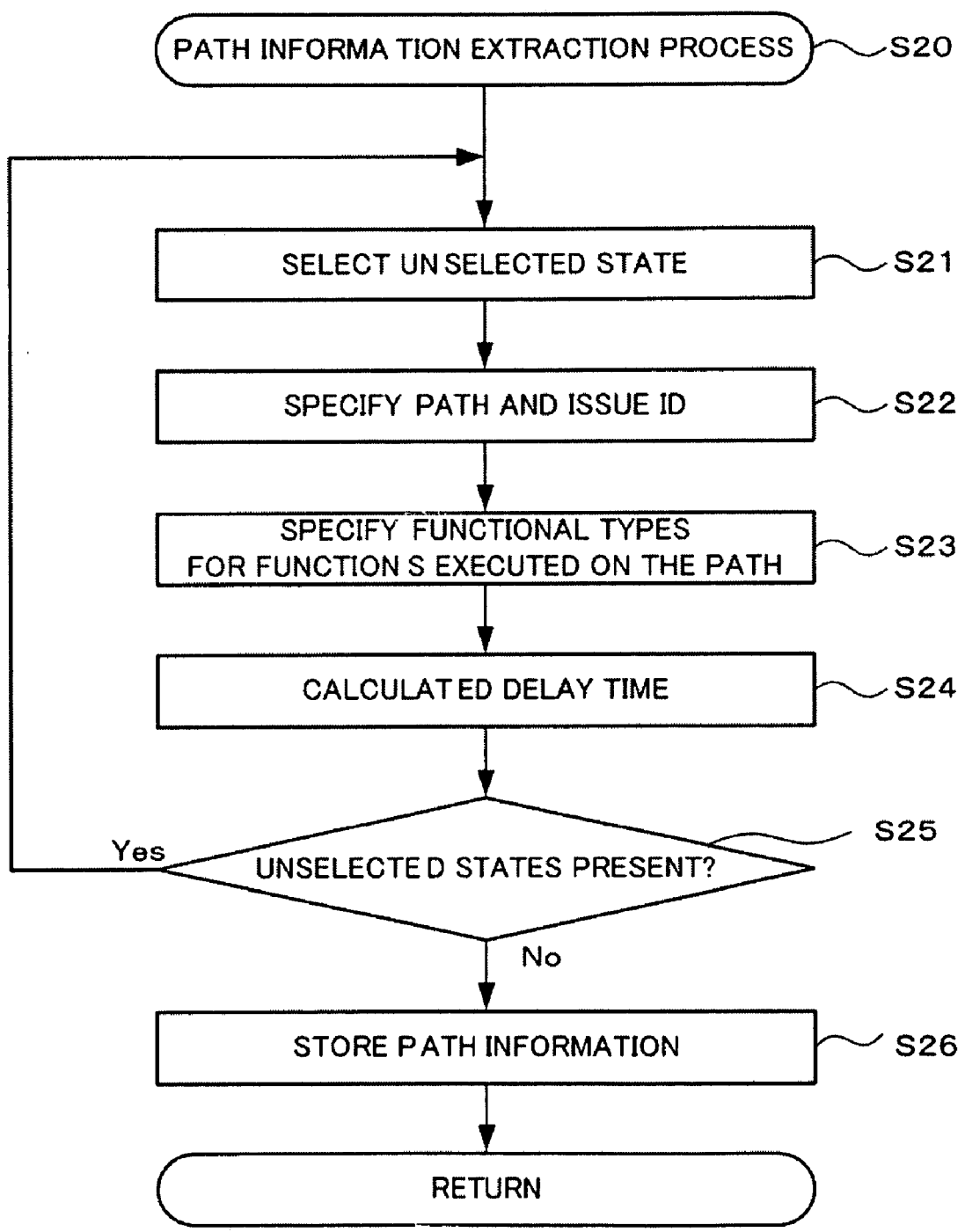
FIG. 7 is a flowchart illustrating path information extraction processing.

A description of the details of the path information extraction processing (step S20) is given in FIG. 7.

When the path information extraction processing commences, first, the data flow path information analyzing unit 32 selects one of an unselected states (steps) included in the CDFG (step S21).

The data flow path information analyzing unit 32 specifies the paths on the data flow occurring within the selected state (step) and issues a unique ID (path ID) every specified path (step S22).

The data flow path information analyzing unit 32 then specifies the functional type of functions executed on the path every specified path (step S23).

The data flow path information analyzing unit 32 then refers to the library information and the synthesis constraint information and calculates delay times every path (step S24).

The data flow path information analyzing unit 32 then determines whether or not a state that has not yet been selected exists within the CDFG (step S25).

When it is determined that a state exists (step S25: Yes), the data flow path information analyzing unit 32 repeats the processing from steps S21 to S24.

When it is determined that a state (step) does not exist (step S25: No), the data flow path information analyzing unit 32 stores the extracted path information (circuit configuration elements and delay time on the path) in the path information storage area 25 every state (step S26), and ends the path information extraction processing.

An explanation is given of this path information extraction processing in the following a specific example. The case is considered where the CDFG shown in FIG. 5 is taken as the subject of this path information extraction processing. It is assumed that the library information shown in FIG. 3 is stored in the library storage area 22 and the synthesis constraint information shown in FIG. 4 is stored in the synthesis constraint storage area 23.

In this event, the data flow path information analyzing unit 32 first selects the state of step 1 of the CDFG shown in FIG. 5 (step S21). The data flow path information analyzing unit 32 then specifies a path occurring within the selected state for step 1 of the CDFG (step S22). In this event, three paths (A) to (C) of (A) a path (hereinafter described as [{a0, a1}→t0→t2] as necessary) where data a0 (or data a1) supplied to an operation node n1 is supplied sequentially via the operation node n1 and the operation node n3 and is outputted from the operation node n3 as the data t2, (B) a path (hereinafter described as [{b0, b1}→t1→t2] as necessary) where data b0 (or data b1) supplied to the operation node n2 sequentially passes via the operation node n2 and the operation node n3 so as to be outputted from the operation node n3 as data t2, and (C) a path (hereinafter described as [{e0, e1}→t4→t5] as necessary) where data e0 (or data e1) supplied to the operation node n6 passes sequentially via the operation node n6 and the operation node n7 so as to be outputted as data t5 from the operation node n7 are specified. The data flow path information analyzing unit 32 then issues unique path IDs P1 to P3 for the three paths (A) to (C) respectively (step S22).

The data flow path information analyzing unit 32 then specifies the functional type of functions executed on each of the above-mentioned paths (A) to (C) (step S23). The inclusion of the operation node n1 executing 4-bit addition processing and the operation node n3 executing 6-bit addition processing is specified in the path (A). Similarly, the inclusion of the operation node n2 executing 5-bit addition processing and the operation node n3 executing 6-bit addition processing is specified in the path (B). The inclusion of an operation node n6 that executes 16-bit addition processing is also specified at the path (C).

The data flow path information analyzing unit 32 then refers to the library information and the synthesis constraint information and calculates delay times every path (A) to (C) (step S24). Namely, for path (A), it is possible to determine that a circuit configuration element corresponding to the operation node n1 is an adder of the library ID of L1 and that a circuit configuration element corresponding to the operation node n3 is an adder of the library ID of L5 by first referring to the synthesis constraint information shown in FIG. 4. It is also possible for 90 to be calculated as the delay time while taking into consideration the chain effect for the adders L1 and L5 by referring to the library information shown in FIG. 3. Similarly, regarding the path (B), an adder with a library ID of L3 can be specified as a circuit configuration element corresponding to the operation node n2 and an adder with a library ID of L5 can be specified as a circuit configuration element corresponding to the operation node n3. A delay time 105 can be calculated by taking into consideration the chain effect. An adder with a library ID of L9 can also be specified for the path (C) as a circuit configuration element corresponding to the operation node n6 and 120 can be calculated as the delay time.

In the above, the acquisition of path information relating to step 1 of the CDFG is complete. When the data flow path information analyzing unit 32 determines that there is a state that has not been selected (step S25: Yes), path information relating to the state that has not been selected is acquired (steps S21 to S24). This means that the data flow path information analyzing unit 32 similarly acquires path information for step 2 in the same way as for path information for step 1. When the data flow path information analyzing unit 32 determines that there is no as yet unselected state, i.e. when it is determined that acquisition of path information is complete for both step 1 and step 2 within the CDFG (step S25: No), the acquired path information is stored in the path information storage area 25 as shown in FIG. 8 (step S26) and the path information extraction processing ends.

The explanation of FIG. 6 is now returned to. When the path information extraction processing is then complete, the synthesis constraint generating unit 33 generates new synthesis constraint information based on the path information stored in the path information storage area 25 in the processing of step S26 and the library information stored in the library storage area 22 (step S30). A circuit implementing the processing represented by the behavioral level description can be implemented by using the circuit configuration elements registered in the library information in accordance with the synthesis constraint information. The type and number of circuit configuration elements can be generated as synthesis constraint information so as to optimize circuit performance of the implemented circuit.

The synthesis constraint generating unit 33 updates the synthesis constraint information stored in the synthesis constraint storage area 23 with the produced synthesis constraint information (step S40).

The synthesis constraint updating processing is then complete.

Processing for making (step S30) and updating (step S40) the synthesis constraint information described above is now explained giving a specific example.

It is also assumed that library information as shown in FIG. 3 is stored in the library storage area 22. It is also taken that a CDFG as shown in FIG. 5 is stored in the intermediate level description storage area 24 as a result of the processing of step S10. It is also taken that path information as shown in FIG. 8 is stored in the path information storage area 25 as a result of the processing of step S20.

As shown in FIG. 4, information specifying the number of circuit configuration elements included in the RT level description is also taken to be stored in the synthesis constraint storage area 23 as synthesis constraint information. It is taken that designation information indicating behavioral synthesis is stored as synthesis constraint information in the synthesis constraint storage area 23 so that delay time up until the output data t2 is outputted in Step 1 together with the delay time until the output data t3 is outputted in Step 2 become minimum. It is also taken that designation information indicating behavioral synthesis ensuring that the area of the operation node n6 for generating the output data t4 in step 1 becomes a minimum with the delay time up until the output data t4 is outputted in Step 1 in a range of 150 or less is stored in the synthesis constraint storage area 23 as the synthesis constraint information. It is also taken that designation information indicating behavioral synthesis ensuring that the area of the operation node n7 for generating the output data t5 in step 1 becomes a minimum with the delay time up until the output data t5 is outputted in Step 1 in a range of 150 or less is stored in the synthesis constraint storage area 23 as the synthesis constraint information.

First, attention is paid to the output data t2 for step 1 within the CDFG shown in FIG. 5.

The synthesis constraint generating unit 33 refers to the path information shown in FIG. 8 and specifies the processing types (operation nodes) of the functions executed on the paths P1 and P2 outputting the data t2. In this event, the operation nodes n1 to n3 can be specified.

The synthesis constraint generating unit 33 then determines a combination of circuit configuration elements capable of being adapted for the operation nodes n1 to n3 by referring to the library information shown in FIG. 3. In this example, adders with a bit width of 4 and library IDs of L1 and L2 correspond to the 4-bit operation node n1, adders with a bit width of 5 and library IDs of L3 and L4 correspond to the 5-bit operation node n2, and adders with a bit width of 6 and library IDs of L5 and L6 correspond to the 6-bit operation node n3. This is to stay that it can be determined that there are eight combinations of circuit configuration elements capable of being adapted for the operation nodes n1 to n3 of (n1, n2, n3)=(L1, L3, L5), (L1, L3, L6), (L1, L4, L5), (L1, L4, L6), (L2, L3, L5), (L2, L3, L6), (L2, L4, L5) and (L2, L4, L6).

The synthesis constraint generating unit 33 then refers to the library information shown in FIG. 3 and determines which of the eight combinations gives a minimum delay time for the data t2 taking into consideration the chain effect. In this example, the combination of (n1, n2, n3)=(L2, L4, L6) gives a delay time of 95 that is a minimum. This combination can then be taken to be new synthesis constraint information. Combinations are also selected for the delay time relating to the output data t3 so as to give a minimum delay time and a combination of (n4, n5)=(L8, L8) is also taken to be new synthesis constraint information.

The synthesis constraint generating unit 33 then takes note of the output data t4 for step 1 within the CDFG shown in FIG. 5. A processing type (operation node) included in the path P3 outputting the data t4 is also specified with reference to the path information shown in FIG. 8. The operation node n6 is specified in this event.

The synthesis constraint generating unit 33 then determines circuit configuration elements capable of adaptation to this operation node n6. In this example, it is determined that it is possible to adapt Adders with a bit width of 16 and library IDs of L9 and L10 to the 16-bit operation node n6 with reference to the library information shown in FIG. 3.

The synthesis constraint generating unit 33 then specifies the adder of the adders L9 and L10 for which adaptation is possible that gives a minimum area for a delay time in the range of 150 or less that is a constraint set for the operation node n6. Referring to the library information shown in FIG. 3, the adders L9 and L10 both satisfy the condition of a delay of 150 or less. The adder L10 of the smaller area is then specified in this case. Namely, synthesis constraint information is generated taking the operation node n6 as the adder L10. Similarly, synthesis constraint information taking the operation node n7 to be the adder L10 is also made for the operation node n7 so that the delay time is 150 or less and the area becomes a minimum.

When generation of the new synthesis constraint information is completed (i.e. the type and number of circuit configuration elements intended for inclusion in the RT level description are specified), the synthesis constraint generating unit 33 updates the synthesis constraint information stored in the synthesis constraint storage area 23 to the new synthesis constraint information shown in FIG. 9.

Operations to be performed in different steps can be performed by a functional unit. Specifically, in both of the operation nodes n6, n7, the adder L10 is specified as the constraint information: there the number of constraint is 1.

The behavioral synthesis device 100 of this embodiment is capable of updating (improving) existing synthesis constraint information based on path information where a CDFG made in a scheduling process while subjecting a behavioral level description to behavioral synthesis is analyzed and library information. Namely, it is anticipated that an electronic circuit acquired as the result of logic synthesis of a register transfer level description generated based on the behavioral level description so as to satisfy constraints indicated by the new synthesis constraint information generated by the synthesis constraint generating unit 33 will improve circuit performance more than an electronic circuit acquired through the logic synthesis of a register transfer level description generated based on a behavioral level description so as to satisfy constraints indicated by synthesis constraint information stored in advance in the synthesis constraint storage area 23.

The present invention is by no means limited to that shown in the embodiments above and various modifications and applications are possible.

For example, in the synthesis constraint updating processing in this embodiment, path information is acquired through the analysis of a CDFG (step S20). However, it is also possible to acquire path information through the analysis of an intermediate level description made by a scheduling process other than CDFG.

Further, in the path information extraction processing (step S20, FIG. 7) of this embodiment, calculation of the delay time of the path is executed (step S24). However, this process is by no means essential when information relating to the operation frequency (delay) cannot be provided as synthesis constraint information.

In this embodiment, a specific example of the synthesis constraint updating processing is explained in taking the case of adopting an adder as the circuit configuration element as an example. However, it is also possible to adopt functional elements such as subtractors, storage elements such as registers or input/output terminals etc. as circuit configuration elements. In this case, it is necessary for the circuit configuration elements to be appropriately classified as processing attributes (processing attributes such as a number of configuration bits in, for example, the case of a register) corresponding to circuit configuration elements and information (delay time, area etc.) relating to circuit performance that is registered as library information.

In this embodiment, an example is shown where the synthesis constraint information is generated so that respective delay times every path where one or more circuit configuration elements are executed in a single step become the same or shorter than times corresponding to the respective paths. However, it is also possible for synthesis constraint information to be generated so that the largest delay time of the delay times every path where one or more circuit configuration elements executed in a single step included on this path becomes the same or shorter than a prescribed time. In this event, it is possible to ensure an operating frequency that corresponds to the prescribed time.

An example is shown in this embodiment where a delay time every path is included in the path information. However, it is also possible for new synthesis constraint information to be generated without the delay time being included in every path in the path information. It is also preferable for a delay time to be included in every path in the path information when an operating frequency of a prescribed frequency or more must be ensured. In this event, for example, it can be anticipated that it will be possible to easily ensure an operating frequency of a prescribed frequency or more by generating the synthesis constraint information so that circuit configuration elements on the path are replaced with circuit configuration elements of a small delay time for paths where, for example, the delay time is comparatively large.

A behavioral level description described using SystemC is shown in FIG. 2 etc. as a specific example of a behavioral level description in this embodiment. However, the behavioral level description is by no means limited in this respect and can also be a programming language such as the C-language or Java (registered trademark) etc. or another HDL (Hardware Description Language) etc.

In this embodiment, an example is shown where the behavioral synthesis device updates the synthesis constraint information. However, it is also possible for a data processing device that does not execute behavioral synthesis to update the synthesis constraint information using the methods described above. In this event, the behavioral synthesis is executed by another data processing device (behavioral synthesis device) using the updated synthesis constraint information.

The behavioral synthesis device of the present invention is by no means limited to being implemented using dedicated hardware and can also be implemented by a typical computer.

Specifically, in the above embodiment, an explanation is given where a program of the behavioral synthesis device is stored in advance in memory etc. However, it is also possible for a program profiling device that executes the processing described above to be configured by storing a program for executing the processing operations described above on a computer readable recording medium such as a flexible disk, a CD-ROM (Compact Disc Read-Only Memory), a DVD (Digital Versatile Disc), or an MO (Magneto-Optical Disc) etc. for distribution, and installing this program oil a computer.

It is also possible to install the program in advance on a disk device etc. comprised in a server device on a communication network such as the Internet for downloading etc. to the computer as the result of, for example, superimposition on a carrier wave. It is also possible to implement the processing described above by starting up and executing the program while transferring the program via a communication network.

When the above functions are shared with the OS (Operating System) or are implemented as the result of an OS and an application working in cooperation etc., it is also possible for just portions other than the OS to be stored on a medium for distribution or downloaded to a computer.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A data processing device comprising:
a behavioral level description receiving unit that receives input of a behavioral level description describing behavior of an electronic circuit to be mounted on a semiconductor integrated circuit;
a synthesis constraint information receiving unit that receives input of synthesis constraint information constituting constraints to be satisfied while generating a register transfer level description based on the behavioral level description, the constraints indicates the type and number of circuit configuration elements that are describable in the register transfer level description;
an intermediate level description generating unit that generates an intermediate level description that describes a plurality of processes running on the data processing device and indicated by the behavioral level description and data passed over during the plurality of processes based on the behavioral level description and the received synthesis constraint information;
a path information acquiring unit that acquires path information indicating a data path and at least one process executed on the data path based on the intermediate level description; and
a synthesis constraint information generating unit that generates new synthesis constraint information that improves prescribed circuit performance of the electronic circuit based on library information specifying circuit configuration elements that are describable in the register transfer level description and the path information.

2. The data processing device according to claim 1, wherein information indicating timings of execution of the plurality of processes indicated in the behavioral level description is included in the intermediate level description, and
the path information acquiring unit, where a number of said at least one process executed on the path is multiple, acquires the path information so that the multiple processes are executed simultaneously.

3. The data processing device according to claim 2, wherein information indicating a delay time from data being supplied to a circuit configuration element to being outputted is included in the library information, and
the synthesis constraint information generating unit generates the type and number of circuit configuration elements necessary for deciding circuit configuration elements for respectively implementing at least one of the processes executed on the path as the new synthesis constraint information based on information indicating the delay time in such a manner that the delay time from the data being supplied to the path until the data is outputted becomes a minimum.

4. The data processing device according to claim 3, wherein information relating to results of reducing delay time when a plurality of the circuit configuration elements are connected together is included in the library information, and
the synthesis constraint information generating unit generates the type and number of circuit configuration elements necessary for deciding circuit configuration elements for respectively implementing at least one of the processes executed on the path as the new synthesis constraint information based on information indicating the delay time and information relating to the results of reducing the delay time in such a manner that the delay time from the data being supplied to the path until the data is outputted becomes a minimum.

5. The data processing device according to claim 2, wherein information indicating a delay time from data being supplied to the circuit configuration element to being outputted and information indicating area of the circuit configuration elements is included in the library information, and
the synthesis constraint information generating unit generates the type and number of circuit configuration elements required when deciding circuit configuration elements for respectively implementing at least one process executed on the path as the new synthesis constraint information based on information indicating the delay time and information indicating the area so that a sum of the areas for the circuit configuration elements respectively implementing the at least one process executed on the path becomes a minimum as far as delay time from the data be supplied to the path to being outputted does not exceed a prescribed time.

6. A behavioral synthesis device comprising: a behavioral level description receiving unit that receives input of a behavioral level description describing the behavior of an electronic circuit to be mounted on a semiconductor integrated circuit;
a synthesis constraint information receiving unit that receives the input of synthesis constraint information constituting constraints to be satisfied while generating a register transfer level description based on the behavioral level description, the constraints indicates the type and number of circuit configuration elements that are describable in the register transfer level description;
an intermediate level description generating unit that generates an intermediate level description that describes a plurality of processes indicated by the behavioral level description and running on the behavioral synthesis device and data passed over during the plurality of processes based on the behavioral level description and the received synthesis constraint information;
a path information acquiring unit that acquires path information indicating the data path and at least one process executed on the data path based on the intermediate level description;
a synthesis constraint information generating unit that generates new synthesis constraint information that improves prescribed circuit performance of the electronic circuit based on library information specifying circuit configuration elements that are describable in the register transfer level description and the path information; and
a behavioral synthesis unit that generates a register transfer level description based on the behavioral level description so as to satisfy constraints indicated by the newly generated synthesis constraint information.

7. A data processing method executed by a data processing device having a processor, a behavioral level description receiving unit, a synthesis constraint information receiving unit, an intermediate level description generating unit, a path information acquiring unit, and a synthesis constraint information receiving unit, one or more of the units each implemented as a computer program executable by the processor, the method comprising:
a behavioral level description receiving step of receiving, by the behavioral level description receiving unit, input of a behavioral level description describing behavior of an electronic circuit to be mounted on a semiconductor integrated circuit;
a synthesis constraint information receiving step of receiving, by the synthesis constraint information receiving unit, input of synthesis constraint information constituting constraints to be satisfied while generating a register transfer level description based on the behavioral level description, the constraints indicates the type and number of circuit configuration elements that are describable in the register transfer level description;

an intermediate level description generating step of generating, by the intermediate level description generating unit, an intermediate level description that describes a plurality of processes indicated by the behavioral level description running on the data processing device and data passed over during the plurality of processes based on the behavioral level description and the received synthesis constraint information;

a path information acquiring step of acquiring, by the path information acquiring unit, path information indicating the data path and at least one process executed on the data path based on the intermediate level description; and a synthesis constraint information generating step of generating, by the synthesis constraint information generating unit, new synthesis constraint information that improves prescribed circuit performance of the electronic circuit based on library information specifying circuit configuration elements that are describable in the register transfer level description and the path information.

8. A non-transitory computer readable recording medium on which a computer program is recorded that permits a computer to function as:

a behavioral level description receiving unit that receives input of a behavioral level description describing the behavior of an electronic circuit to be mounted on a semiconductor integrated circuit;

a synthesis constraint information receiving unit that receives the input of synthesis constraint information constituting constraints to be satisfied while generating a register transfer level description based on the behavioral level description, the constraints indicates the type and number of circuit configuration elements that are describable in the register transfer level description;

an intermediate level description generating unit that generates an intermediate level description that describes a plurality of processes running on the computer and indicated by the behavioral level description and data passed over during the plurality of processes based on the behavioral level description and the received synthesis constraint information;

a path information acquiring unit that acquires path information indicating the data path and at least one process executed on the data path based on the intermediate level description; and a synthesis constraint information generating unit that generates new synthesis constraint information that improves prescribed circuit performance of the electronic circuit based on the library information specifying circuit configuration elements that are describable in the register transfer level description and the path information.

* * * * *